United States Patent [19]
Itoh

[11] Patent Number: 6,099,578
[45] Date of Patent: Aug. 8, 2000

[54] METHOD OF ESTIMATING WIRE LENGTH INCLUDING CORRECTION AND SUMMATION OF ESTIMATED WIRE LENGTH OF EVERY PIN PAIR

[75] Inventor: Toshiaki Itoh, Hyogo, Japan

[73] Assignee: Mitsubishi Denki Kabushiki Kaisha, Tokyo, Japan

[21] Appl. No.: 09/033,934

[22] Filed: Mar. 2, 1998

[30] Foreign Application Priority Data

Aug. 25, 1997 [JP] Japan ...................................... 9-228243

[51] Int. Cl.[7] .................................................. G06F 15/00
[52] U.S. Cl. ................................................. 716/4; 716/12
[58] Field of Search ...................... 395/500.05, 500.06, 395/500.07, 500.11, 500.13, 500.14; 716/4, 5, 6, 10, 12, 13

[56] References Cited

U.S. PATENT DOCUMENTS

| | | | |
|---|---|---|---|
| 5,311,443 | 5/1994 | Crain et al. | 395/500.11 |
| 5,475,607 | 12/1995 | Apte et al. | 395/500.11 |
| 5,550,748 | 8/1996 | Xiong | 395/500.14 |
| 5,596,505 | 1/1997 | Steinweg et al. | 395/500.07 |
| 5,629,860 | 5/1997 | Jones et al. | 395/500.07 |
| 5,875,114 | 2/1999 | Kagatani et al. | 395/500.07 |

FOREIGN PATENT DOCUMENTS

| | | |
|---|---|---|
| 4-283943 | 3/1991 | Japan . |
| 8-186178 | 12/1994 | Japan . |
| 9-81621 | 9/1995 | Japan . |

OTHER PUBLICATIONS

Hamada, T., Chung–Kuan Cheng, and Chau, P.M., "A Wire Length Estimation Technique Utilizing Neighborhood Density Equations", IEEE Transactions on Computer–Aided Design of Integrated Circuits and Systems, vol. 15, No. 8, Aug. 1996, pp. 912–922, Aug. 1996.

Davis, J.A., De, V.K., and Meindl, J.D., "A Priori Wiring Estimations and Optimal Multilevel Wiring Networks For Portable ULSI Systems", Proceedings of the 46th Conference on Electronic Components and Technology, 1996, pp. 1002–1008, May 31, 1996.

Ramachandran, C. and Kurdahi, F.J., "Combined Topological and Functionality Based Delay Estimation Using a Layout–Driven Approach for High Level Applications", Proceedings of the Conference on European Design Automation, 1992, pp. 72–78, Sep. 7, 1992.

Pedram, M. and Preas, B., "Accurate Prediction of Physical Design Characteristics for Random Logic", IEEE International Conference on Computer Design: VLSI in Computers and Processors, 1989, pp. 100–108, Oct. 4, 1989.

*Primary Examiner*—Paul R. Lintz
*Assistant Examiner*—Margaret Joyce
*Attorney, Agent, or Firm*—McDermott, Will & Emery

[57] ABSTRACT

In a method of estimating wire length allowing highly precise estimation of the estimated wire length of a net, an object net is selected. Thereafter, the object net is developed into pin pairs. For each of the pin pairs, a subcircuit satisfying a prescribed relation with the pin pair is extracted from the semiconductor integrated circuit. From the subcircuit, information necessary for estimating wire length of the pin pair (number of nets in the subcircuit and total area of macro cells in the subcircuit) is extracted. Based on the extracted information of the subcircuit, estimated wire length of the pin pair is estimated. Based on the estimated wire length of the pin pair, estimated wire length of the object net is estimated.

11 Claims, 18 Drawing Sheets

METHOD OF ESTIMATING WIRE LENGTH INCLUDING CORRECTION AND SUMMATION OF ESTIMATED WIRE LENGTH OF EVERY PIN PAIR

BACKGROUND OF THE INVENTION

1. Field of the Invention

The present invention relates to a method of estimating wire length. More specifically, the present invention relates to a method of estimating wire length allowing highly precise estimation.

2. Description of the Background Art

In a semiconductor integrated circuit, wiring length becomes larger in inappropriately designed circuitry. In other words it takes more time for a signal to pass through the wiring, possibly resulting in a problem that the circuit operation cannot satisfy the required specification.

In view of the foregoing, in designing semiconductor integrated circuits, signal delay time is calculated based on the wiring length, when design of macro cell placement and wirings between macro cells (hereinafter referred to as "placement and wiring") is completed. Based on the calculated delay time, placement and wiring are modified to address inappropriate wiring.

However, modification of placement and wiring after completion of designing leads to large scale modification, and time necessary for modification is considerable. Accordingly, in order to minimize modification after placement and wiring, a wire length is estimated for each net in a semiconductor integrated circuit before placement and wiring. Further, placement and wiring are performed based on the estimated wire length. Here, the term "net" refers to wiring of macro cells.

Conventionally, the estimated wire length of each net has been based on the size of the area of placement to which the net belongs, and a out number of the net described below.

Referring to FIG. 1, the semiconductor integrated circuit includes a net 92 which is an object of estimation, a macro cell 90 connected to net 92 and a placement area 94 including net 92. The boundary length of placement area 94 including net 92 is represented by L, fan out number of net 92 is represented as F and constants determined based on design rule are represented by C1 and C2. The estimated wire length X of net 92 is calculated in accordance with the following equation (1), for example.

$$X = C1 \times L \times F + C2 \tag{1}$$

However, according to the conventional method, estimated wire length X of net 92 is calculated based only on the boundary length of placement area 94 including net 92 which is the object of estimation and on the number of fan out of the object net 92. Therefore, every net belonging to the same placement area 94 and having the same number of fan outs has the same estimated wire length. In an actual semiconductor integrated circuit, even when nets 92 belonging to the same placement area 94 have the same number of fan outs, the estimated wire lengths differ considerably dependent on the position of placement of macro cells 90 to which the nets 92 are connected, respectively. Therefore, for some nets 92, there is considerable difference between the actual wiring length and the estimated wire length, which makes highly precise placement and wiring difficult.

SUMMARY OF THE INVENTION

The present invention was made to solve such problems and its object is to provide a method of estimating wire length allowing highly precise estimation of estimated wire length of a net.

Another object is to provide a method of estimating wire length allowing highly precise estimation of signal delay time.

A further object is to provide a method of estimating wire length allowing highly precise estimation of power consumption of the net.

A still further object is to provide a method of estimating wire length allowing highly precise estimation of minimum area in which a macro cell can be placed and wired.

A still further object is to provide a method of estimating wire length allowing highly precise calculation of expected value of the estimated wire length of the net based on every fan out number.

According to an aspect of the present invention, the method of estimating wire length includes the steps of developing a net on a semiconductor integrated circuit to pin pairs, estimating wire length pin pair by pin pair, and estimating wire length of the net based on the estimated wire length estimated for each pin pair in which the step of estimating wire length pin pair by pin pair includes the steps of extracting a subcircuit satisfying a prescribed relation with a pin pair which is an object of processing, and estimating wire length of the object pin pair based on characteristics of the sub circuit.

According to the present invention, the estimated wire length of the pin pair is estimated based on the characteristic of the sub circuit which satisfies a prescribed relation with each pin pair. Further, estimated wire length of the net is estimated based on the estimated wire length of the pin pair. Accordingly, highly precise estimation of estimated wire length of the pin pair as well as the estimated wire length of the net becomes possible.

Preferably, the step of extracting a sub circuit includes the step of extracting, as a sub circuit, an object pin pair and a macro cell connected to the object pin pair, the sub circuit including an externally connected cell connected to a pin pair outside the subcircuit, the step of extracting a macro cell connected to the externally connected cell, the step of classifying the macro cell connected to the externally connected cell into an already-searched macro cell or a not-yet-searched macro cell, the step of determining whether number of already-searched macro cells and the number of not-yet-searched macro cells satisfy a prescribed relation, when a prescribed relation holds, determining the already-searched macro cell and the pin pair as a subcircuit for the object pin pair and completing the process, and when the prescribed relation does not hold, adding a pin pair connecting a macro cell which is classified to the not-yet-searched macro cell and an externally connected cell in the subcircuit and a macro cell classified to not-yet-searched macro cell, to the subcircuit and returning to the step of extracting.

According to the present invention, a subcircuit which takes into consideration connection strength between macro cells is obtained, and the subcircuit includes sufficient information for estimating wire length of the pin pair. Accordingly, estimated wire length of the pin pair can be estimated with high precision, and hence estimated wire length of the net can be estimated with high precision.

Preferably, the method may further include the step of calculating resistance value of the pin pair based on the estimated wire length of the pin pair, the step of calculating capacitance value of the net based on the estimated wire length of the net, and the step of calculating delay time when a signal passes through a signal path on the net, based on the resistance value of the pin pair and the capacitance value of the net.

According to the present invention, resistance value of the pin pair is calculated based on the highly precise estimated wire length of the pin pair, and capacitance value of the net is calculated based on the highly precise estimated wire length of the net. Therefore, the resistance value of the pin pair and the capacitance value of the net are both of high precision. The delay time when a signal passes through a signal path on the net is calculated based on the highly precise resistance value of the pin pair and the highly precise capacitance value of the net. This allows highly precise estimation of the signal delay time.

Preferably, the method may further include the step of calculating capacitance value of the net based on the estimated wire length of the net, and the step of calculating power consumption of the net based on the capacitance value of the net and a prescribed signal change rate of the net.

According to the present invention, the capacitance value of the net is estimated with high precision based on the estimated wire length of the net estimated with high precision. Power consumption of the net is estimated based on the highly precise capacitance value of the net. This allows highly precise estimation of power consumption of the net.

Preferably, the method may further include the step of calculating total sum of the estimated wire lengths of nets existing in a semiconductor integrated circuit, and the step of calculating minimum area in which macro cells can be placed and virtual wired in the semiconductor integrated circuit device based on the total sum of the estimated wire lengths of the net and an area of aluminum pattern occupied by the macro cells in the semiconductor integrated circuit.

According to the present invention, the number of aluminum routing grids required by the wirings in the semiconductor integrated circuit can be estimated with high precision based on the total sum of estimated wire lengths of the net estimated with high precision and on the area of the aluminum pattern occupied by the macro cells in the semiconductor integrated circuit device. This allows highly precise estimate of the minimum area in which placement and wiring is possible.

Preferably, the method may further include the step of classifying the nets in accordance with the number of fan outs of the nets, and the step of calculating expected value of the estimated wire length of the nets for every fan out number, in accordance with a prescribed rule.

According to the present invention, the estimated wire lengths of the nets estimated with high precision are classified by the number of fan outs, and expected value of the estimated wire length of the net for each fan out number is calculated. Therefore, expected value of the estimated wire length of a net based on the fan out number can be calculated with high precision.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1:
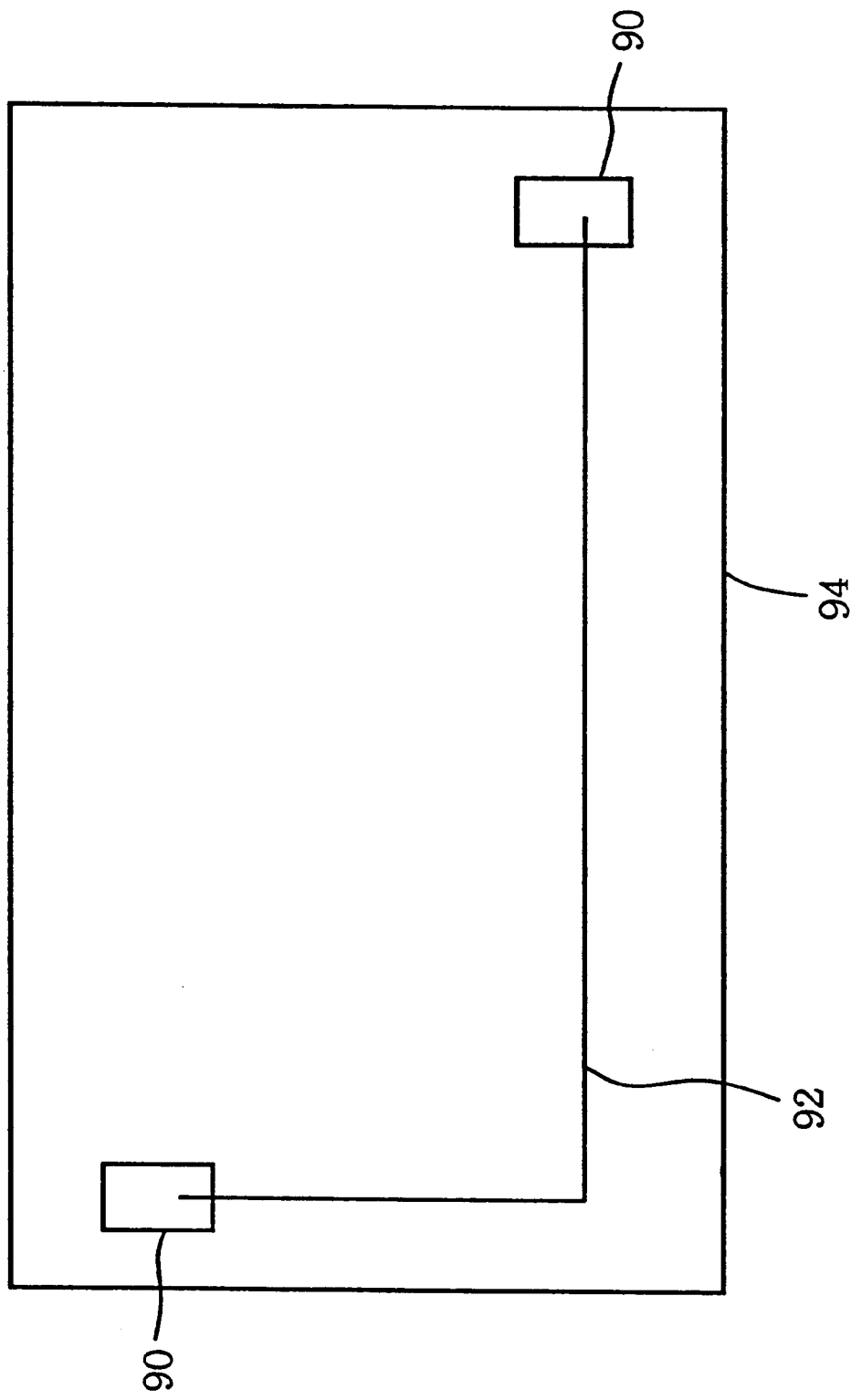
FIG. 1 shows conventional estimation of estimated wire length of a net.

A estimated wire length estimating apparatus which is one embodiment of the present invention will be described with reference to the figures. In the following description, same components will be denoted by the same reference characters and referred to by the same names. Same portions have the same function, and therefore descriptions are not repeated. Throughout the specification, a "macro cell" encompasses a "module" which includes at least one so called macro cell.

Figure 2:
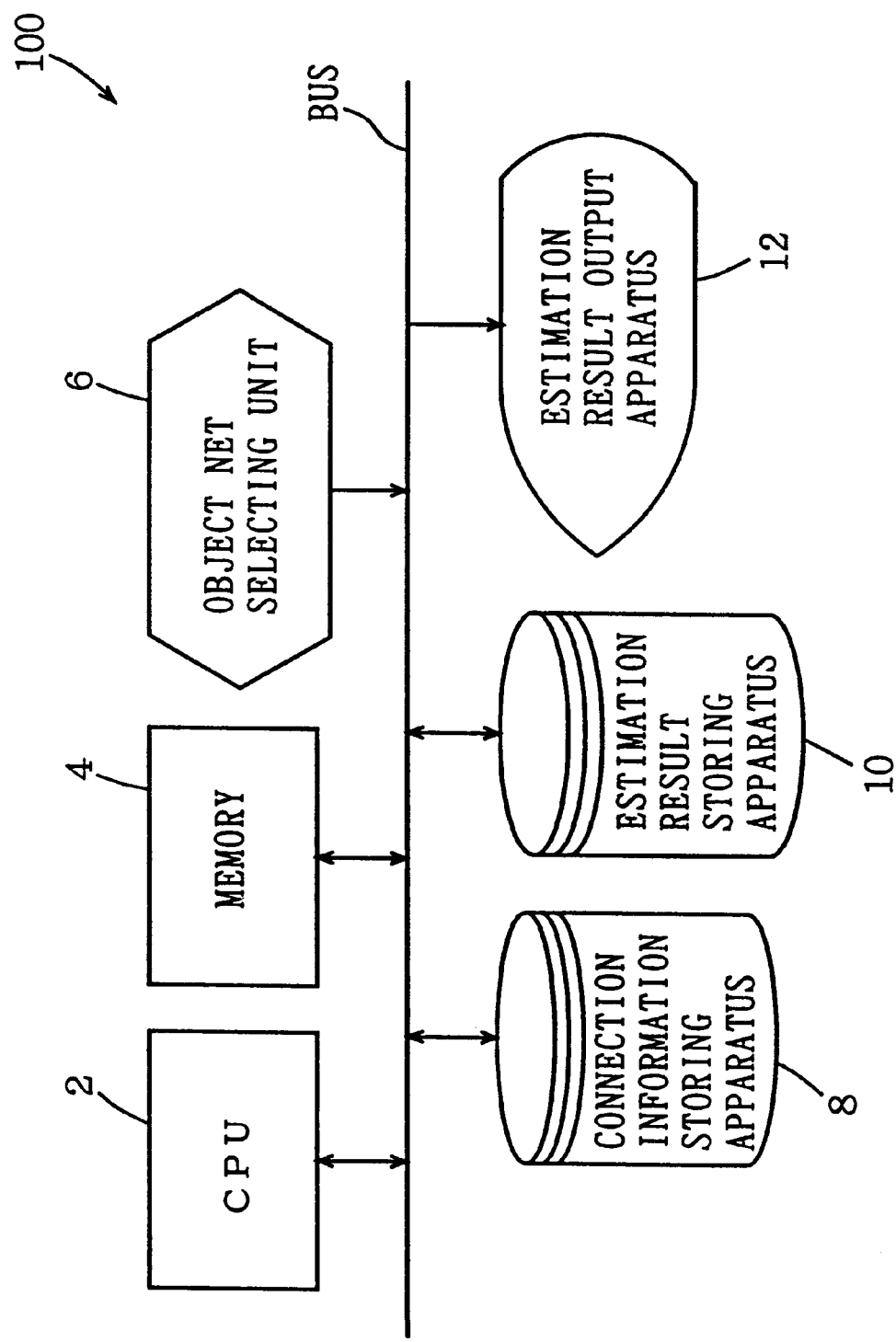
FIG. 2 is a block diagram showing a configuration of a estimated wire length estimating apparatus in accordance with a first embodiment.

Referring to FIG. 2, a wire length estimating apparatus 100 includes a connection information storing apparatus 8 for storing relation of connection between a macro cell and a net on a semiconductor integrated circuit; an object net selecting unit 6 for selecting a net which is an object for estimating wire length; a CPU (Central Processing Unit) 2 for executing the process for estimating the wire length of the net selected by the object net selecting unit 6; a memory 4 for storing a program for the process for estimating wire length and intermediate result of the process; an estimated result output apparatus 12 for presenting estimated wire length to the user; an estimation result storing apparatus 10 for storing the estimated wire length; and a bus for connecting components of estimated wire length estimating apparatus 100 to each other.

Figure 3:
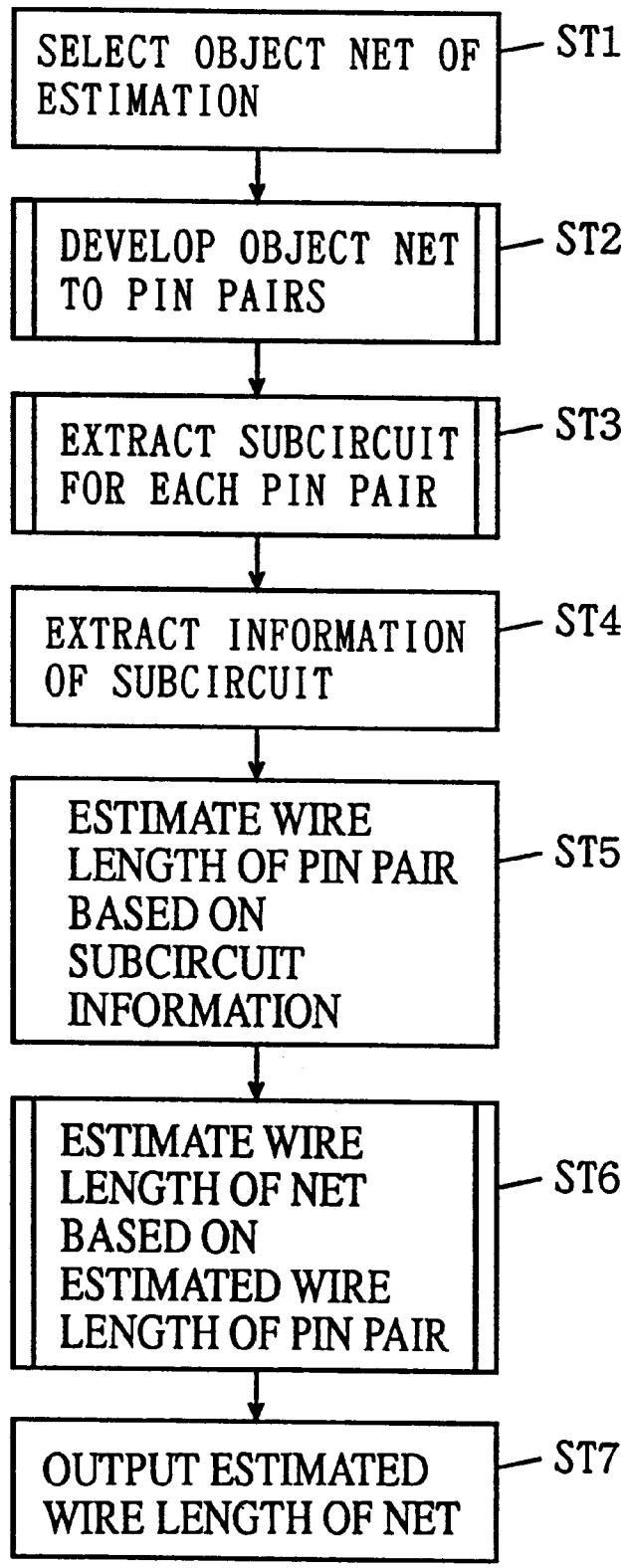
FIG. 3 is a flow chart showing processes performed by the estimated wire length estimating apparatus.

Referring to FIG. 3, the process executed by wire length estimating apparatus 100 will be described. Details of the processes will be described later. A user selects, using object net selecting unit 6, a net including wiring and macro cell of which estimated wire length is to be estimated (ST1). Thereafter, CPU 2 develops the net of which wiring length is to be estimated, to pin pairs (ST2). Here, "pin pair" refers to an edge between nodes of a complete graph in which macro cells on a net serve as nodes. For each pin pair, subcircuit satisfying a prescribed relation with the pin pair is extracted from the semiconductor integrated circuit (ST3). From the subcircuit, information necessary for estimating the wire length of the pin pair (number of pin pairs in the net of the subcircuit and total sum of areas of the macro cells in the subcircuit) is extracted (ST4). Based on the extracted information of the subcircuit, a wire length of the pin pair is estimated (ST5). Based on the estimated wire length of the pin pair, a wire length of the object net is estimated (ST6). The estimated wire length is output through estimating result output apparatus 12 and stored in estimation result storing apparatus 10 (ST7).

Figure 4:
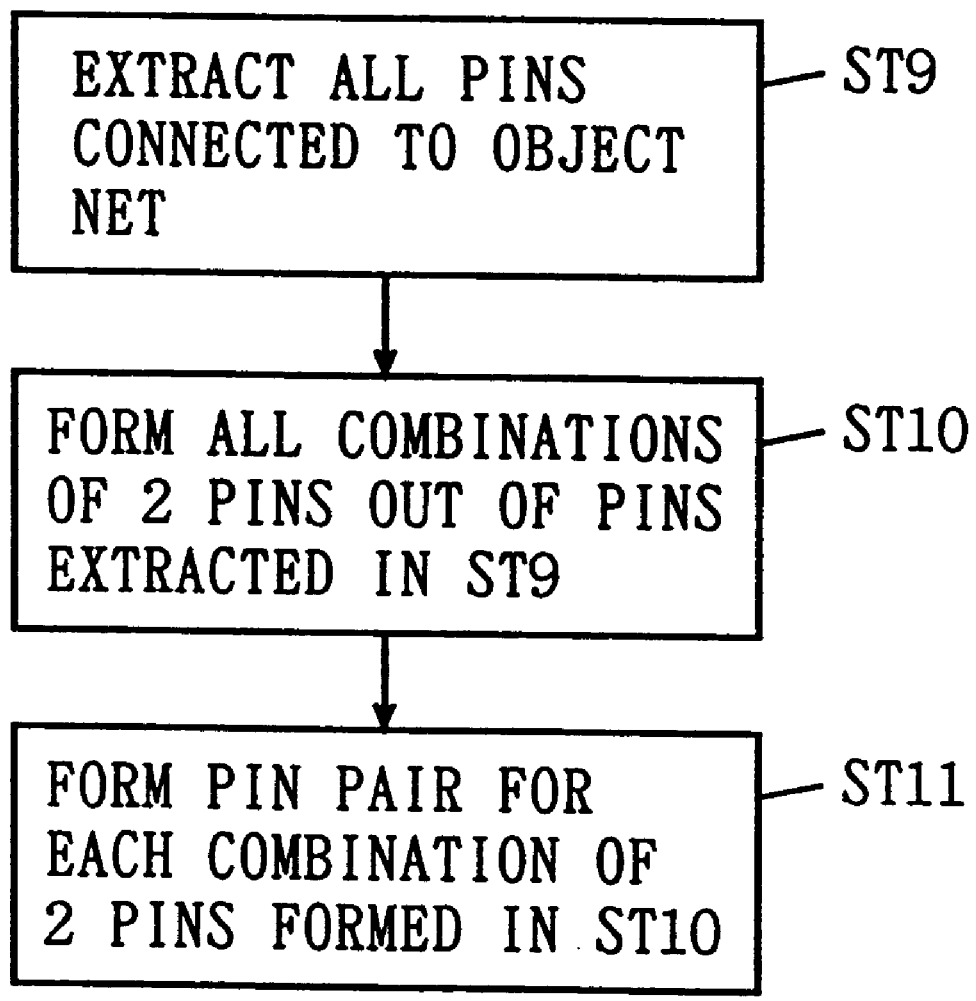
FIG. 4 is a flow chart showing a process of developing an object net to pin pairs.
Figure 5A:
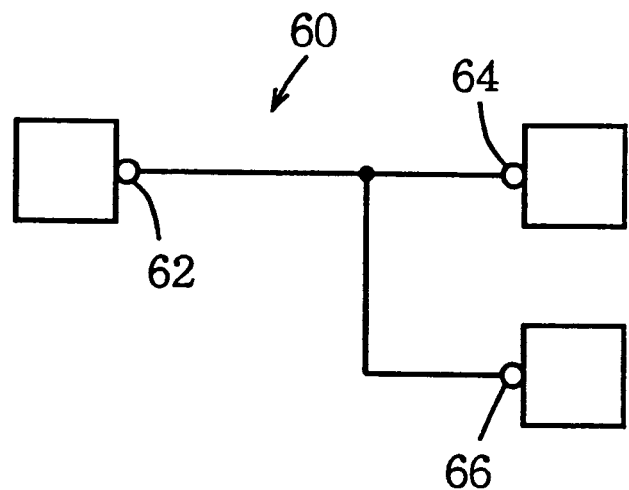
FIGS. 5A to 5C are illustrations showing the process for developing object nets to pin pairs.
Figure 5B:
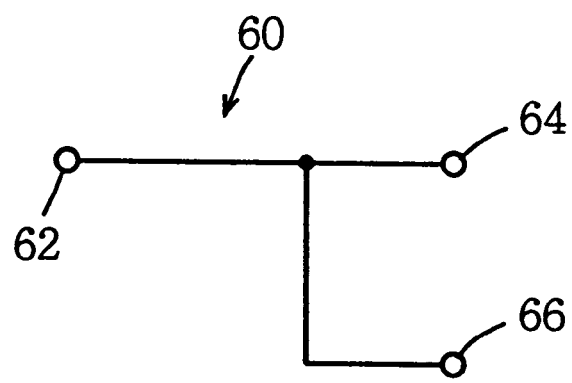
Figure 5C:
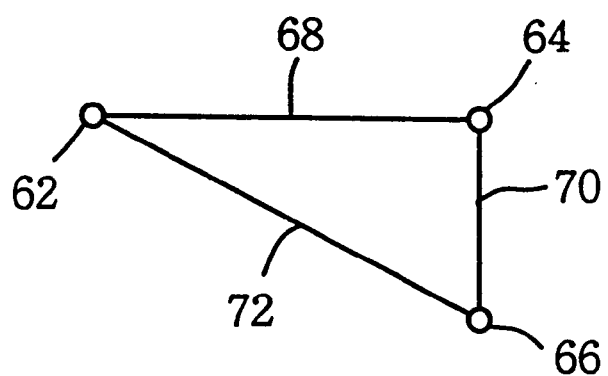

Referring to FIGS. 4 to 5C, the process for developing the object net to pin pairs (ST2) will be described in greater detail. All pins (pins 62, 64 and 66) connected to the object net 60 shown in FIG. 5A are extracted (ST9). Referring to FIG. 5B, all combinations of two of the extracted pins are found (pins 62 and 64, 64 and 66, 66 and 62) (ST10). From the combinations of two pins thus obtained, pin pairs 68, 70 and 72 connecting the pins are found (ST11). Pin pairs correspond to edges of a complete graph in which pins 62, 64 and 66 serve as nodes, as shown in FIG. 5C.

Figure 6:
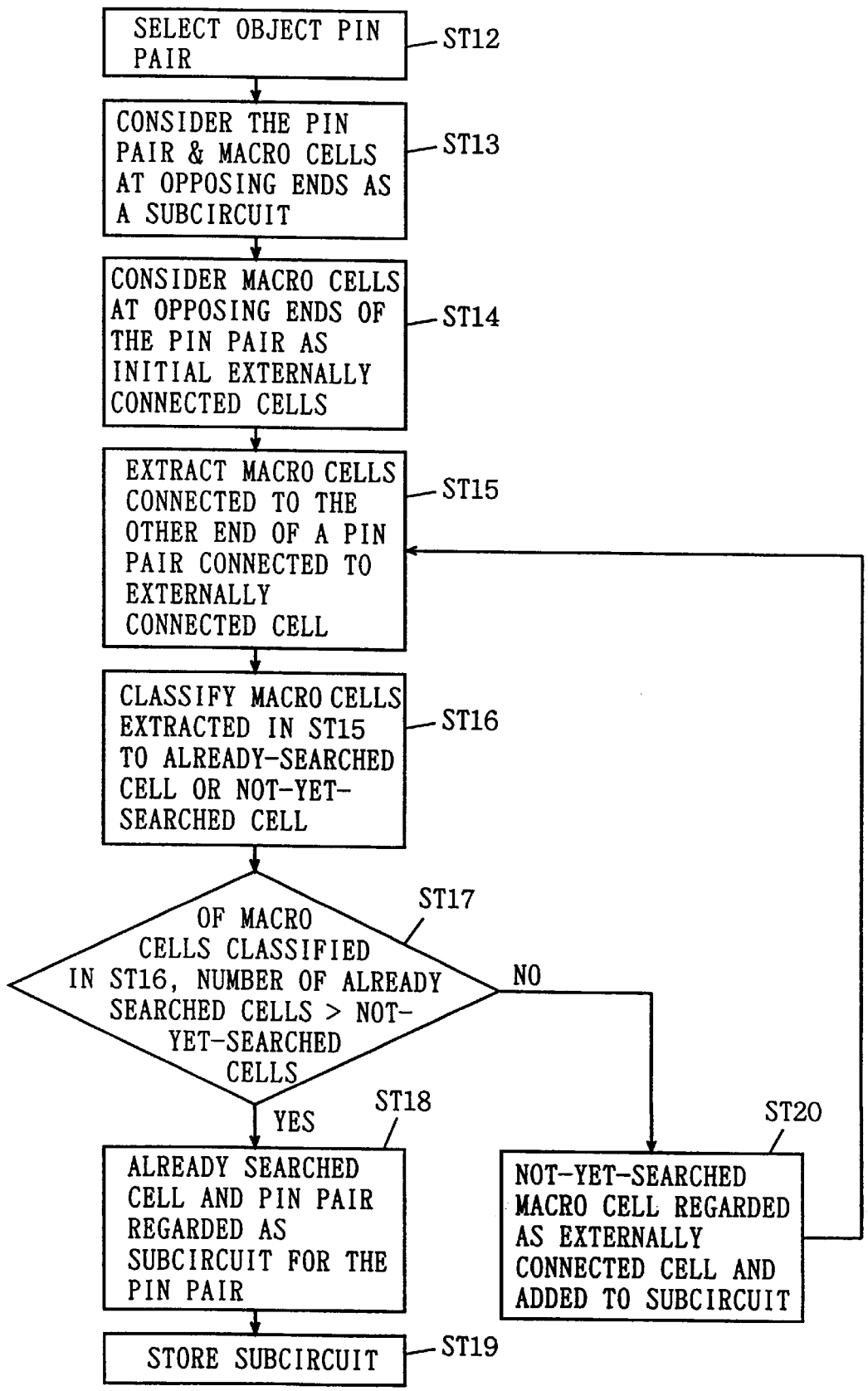
FIG. 6 is a flow chart showing the process for extracting a subcircuit.

Referring to FIGS. 6 to 7C, the process (ST3) for extracting, for each pin pair, a subcircuit satisfying a prescribed relation with the pin pair from the semiconductor integrated circuit will be described in greater detail.

Figure 7A:
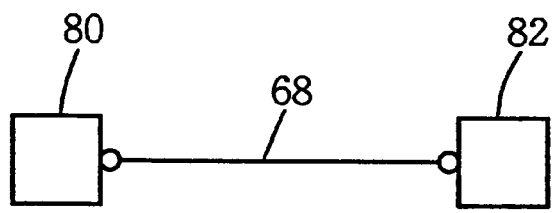
FIGS. 7A and 7B are illustrations showing the process for extracting a subcircuit.

Referring to FIG. 7A, a pin pair is selected from the object net 60 (for example, pin pair 68 is selected) (ST12). Pin pair 68 and macro cells 80 and 82 connected to pin pair 68 are regarded as an initial subcircuit (ST13). Macro cells connected to pin pair 68 are regarded as initial externally connected cells 80 and 82 (cells positioned at the interface between the subcircuit and circuits other than the subcircuit, and included in the subcircuit) (ST14).

Figure 7B:
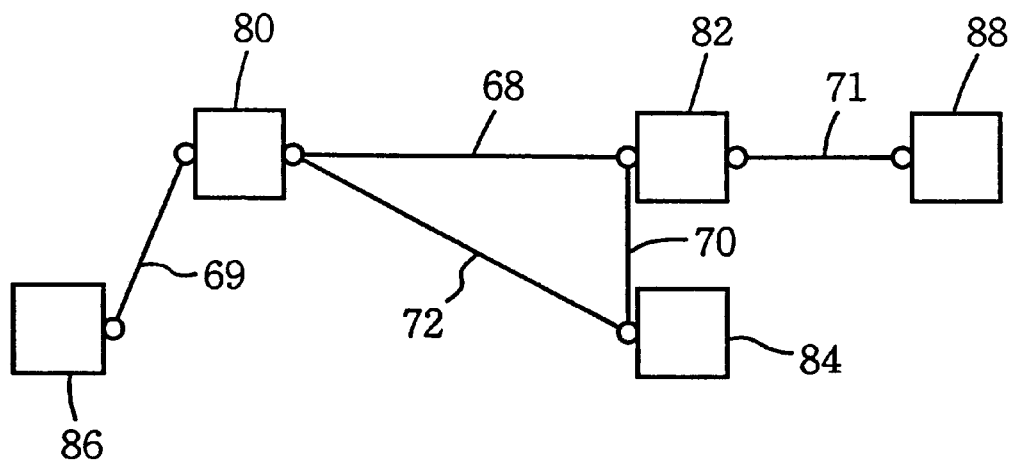

Referring to FIG. 7B, pin pairs 68, 69, 70, 71 and 72 are connected to one of the externally connected cells 80 and 82, and macro cells 80, 82, 84, 86 and 88 positioned at the other end of each of pin pairs 68, 69, 70, 71 and 72 are extracted (ST15). At this time, macro cells 80, 82, 84, 86 and 88 positioned at the other end of each pair may include macro cells 80 and 82 or externally connected cells 80 and 82 which are already included in the subcircuit.

The extracted macro cells 80, 82, 84, 86 and 88 are classified into not-yet-searched macro cells 84, 86 and 88 (macro cells not included in the subcircuit) and already-searched macro cells 80 and 82 (macro cells included in the subcircuit) (ST16).

The number of not-yet-searched macro cells 84, 86 and 88 and the number of already-searched macro cells 80 and 82 are compared with each other (ST17). When the number of already-searched macro cells 80 and 82 is larger than the number of not-yet-searched macro cells 84, 86 and 88 (YES in ST17), the already-searched macro cells 80 and 82 are considered a subcircuit corresponding to pin pair 68 (ST18)

and stored in memory 4 (ST19). In other words, extraction of the subcircuit is completed. When the number of not-yet-searched macro cells 84, 86 and 88 is not smaller than the number of already-searched macro cells 80 and 82 (NO in ST17), the not-yet-searched macro cells 84, 86 and 88 are added to the subcircuit as new externally connected cells (ST20), and the process following step ST15 is repeated. In the example shown in FIG. 7B, the number of not-yet-searched macro cells 84, 86 and 88 is larger than the number of already-searched macro cells 80 and 82.

The process (ST5) for estimating wire length of pin pair 68 based on the information of the subcircuit will be described. The estimated wire length of pin pair 68 is estimated in accordance with the following equation (2).

$$L = \alpha \times \frac{Netnum \times \alpha \times \beta + \sqrt{(Netnum \times \alpha \times \beta)^2 + Cellsize \times 4}}{2} \quad (2)$$

L: Estimated value of estimated wire length of the pin pair

Netnum: Number of pin pairs in the net of the subcircuit (a unit: pin pair)

Cellsize: Total sum of areas of macro cells in the subcircuit

α: Coefficient for finding estimated wire length estimation of the pin pair from half the boundary length of minimum rectangular region of the subcircuit β: Coefficient for finding wiring area The process how the equation (2) is derived will be described. An area of a rectangular region when macro cells are arranged not overlapping with each other in a rectangle without considering connection between nodes and edges of a subgraph (a graph in which a macro cell in the subcircuit is a node and a pin pair is an edge) will be represented by the reference character S. Wiring length of pin pair 68 is proportional to square root of S. This is because connection strength between pin pairs in the subgraph can be considered approximately uniform. At this time, when two macro cells are taken out arbitrarily, the expected value of the distance between the macro cells is always the same. The expected value of the distance is proportional to the longest distance between two macro cells without any redundant path in the rectangular region having the area S, that is, a value proportional to half the boundary length of the rectangular region (the value proportional to the square root of S). Therefore, the following equation (3) holds.

S represents total sum of areas of the macro cells and areas of wirings in a densely coupled subgraph. Accordingly, the following equation (4) holds.

$$L = \alpha \times \sqrt{S} \quad (3)$$

$$S = Cellsize + Netsize \quad (4)$$

Cellsize: Total sum of macro cell areas

Netsize: Total sum of wiring areas

The total sum Netsize of the areas of wiring represents total sum of areas occupied by various nets in the subgraph. The expected values of lengths of pin pairs in a densely coupled subgraph can be represented by the same length L. Accordingly, the following equation (5) holds. Here, Netnum represents a value, in pin pair number equivalent, of the number of nets.

By substituting equation (3) into equation (5) and further by substituting the result into equation (4), the following equation (6) is derived.

When we consider equation (6) a quadratic equation for the square root of S, the following equation (7) is obtained from quadratic formula.

$$\text{Netsize} = \text{Netnum} \times \beta \times L \tag{5}$$

$$S = \text{Cellsize} + \text{Netnum} \times \beta \times \alpha \times \sqrt{S} \tag{6}$$

$$\sqrt{S} = \frac{\text{Netnum} \times \alpha \times \beta + \sqrt{(\text{Netnum} \times \alpha \times \beta)^2 + \text{Cellsize} \times 4}}{2} \tag{7}$$

By substituting equation (7) into equation (3), the equation (2) for calculating estimated wire length of the pin pair is obtained.

Figure 8:
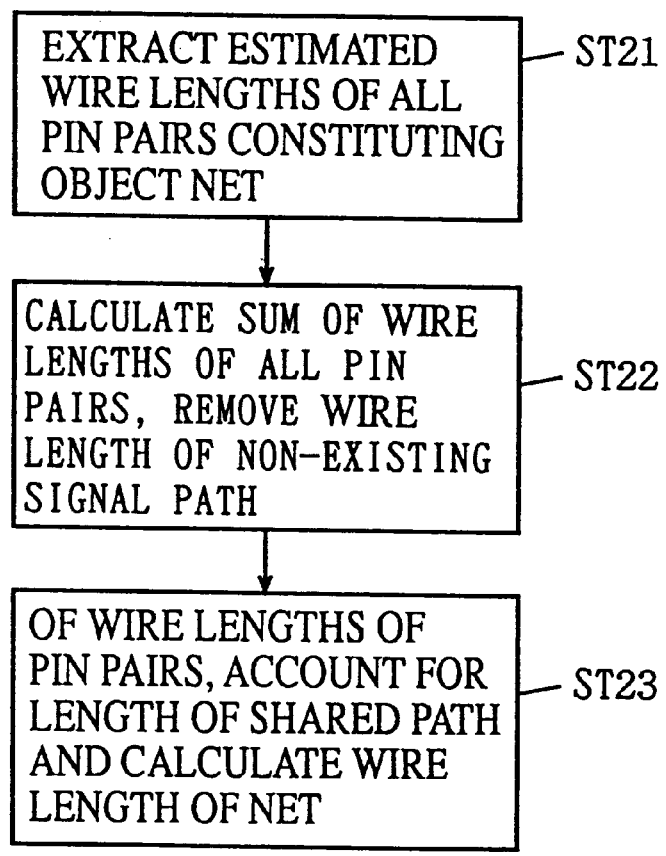
FIG. 8 is a flow chart showing the process for estimating wire length of a net.

The process (ST6) for estimating wire length of the net based on the estimated wire length of pin pairs will be described with reference to FIG. 8.

First, all the pin pairs constituting the object net are extracted (ST21). Of the extracted pin pairs, those for which there is not an actual wiring are removed, and sum of estimated wire lengths of pin pairs (estimated value of estimated wire length of the net) N' is calculated. In the present embodiment, the estimated value of the estimated wire length of each pin pair is approximated by the average value of the expected values of estimated wire lengths of all the pin pairs, to obtain the estimated value N' of the estimated wire length of the net in accordance with the following equation (8) (ST22). Here, preliminary estimated wire length represents sum of estimated wire lengths of all the pin pairs extracted in step ST21, and n represents the number of nodes in the net. The denominator of the fractional expression of equation (8) represents the number of edges of the complete graph, that is, the number of pin pairs. The numerator (=n−1) of the fractional expression represents fan out number of the net, that is, number of pin pairs for which there are actual wirings.

$$N' = \frac{n-1}{{}_nC_2} \times \text{preliminary estimated wire length} \tag{8}$$

The estimated value N' of the estimated wire length of the net is calculated based on the total sum of the estimated wire lengths of respective pin pairs. Therefore, if a wiring portion shared by two or more pin pairs, the estimated wire length of the shared wiring is added repeatedly to the estimated value N' of the estimated wire length of the net. In order to remove this repeated portion, the value N' is converted in accordance with the following equation (9) to obtain estimated value N of estimated wire length of the net (ST23).

Figure 9A:
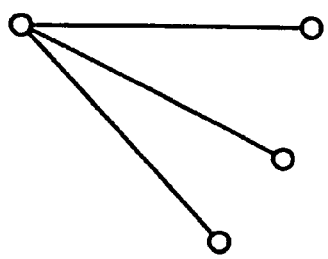
FIGS. 9A and 9B are illustrations showing the steps how the expression for estimating the net is derived.
Figure 9B:
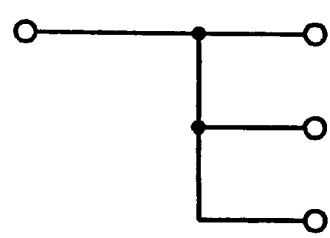

The process how the equation (9) is derived will be described. Referring to FIG. 9A, the estimated value N' of the estimated wire length of the net is calculated as a total sum of the estimated wire lengths of pin pairs in the graph. Accordingly, the estimated wire length L1 of each pin pair is represented by the equation (10). However, in actual wiring, there is a portion shared by pin pairs, as shown in FIG. 9B. When we represent ratio of the shared wiring portion with respect to the remaining portion of the estimated value N of the estimated wire length of the net as γ:1−γ, then the estimated wire length L2 of each pin pair can be represented by the following equation (11). The value L1 is equal to the value L2. Therefore, assume that the right side of equation (10) equals the right side of equation (11), the equation (12) results. When the equation (12) is solved for N, the equation (9) is obtained.

$$N = \left(\frac{1}{(n-1) \times \gamma + 1}\right) \times N' \tag{9}$$

$$L1 = \frac{1}{n} \times N' \tag{10}$$

$$L2 = \left(\gamma + \frac{1-\gamma}{n}\right) \times N \tag{11}$$

$$\frac{1}{n} \times N' = \left(\gamma + \frac{1-\gamma}{n}\right) \times N \tag{12}$$

By the estimated wire length estimating apparatus 100, highly precise estimated wire length of the pin pair can be obtained, using a subcircuit obtained for each pin pair. Further, the using the estimated wire lengths of the pin pairs, the estimated wire length of the net without repetitively counting the estimated wire length of a pin pair is obtained. Therefore, highly precise estimation of the estimated wire length of the net is possible.

Our study revealed that the estimated wire length of the net could be estimated with higher precision than by the conventional method.

Second Embodiment

A timing verifying apparatus which is another embodiment of the present invention will be described.

Figure 10:
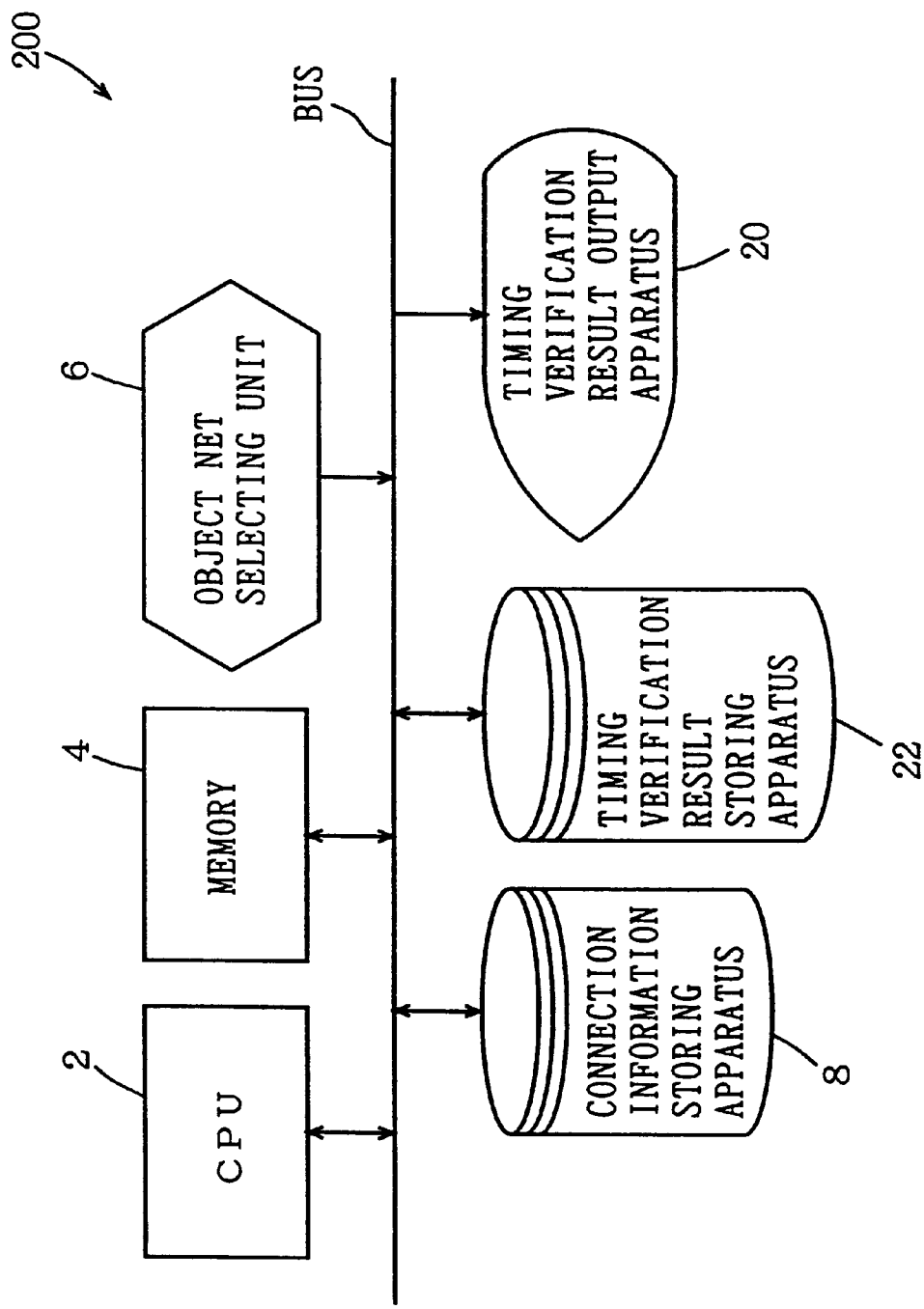
FIG. 10 is a block diagram showing configuration of a timing verifying apparatus in accordance with a second embodiment.

Referring to FIG. 10, timing verifying apparatus 200 includes: a connection information storing apparatus 8 for storing relation of connection between micro cells and nets on a semiconductor integrated circuit; an object net selecting unit 6 for selecting a net for which timing verification is to be performed; a CPU 2 for verifying timing of the net selected by the object net selecting unit 6; a memory 4 for storing a program for timing verification and intermediate result of processing; a timing verification result output apparatus 20 for presenting result of timing verification to the user; a timing verification result storing apparatus 22 for storing the result of timing verification; and a bus for connecting components of timing verifying apparatus 200 to each other.

Figure 11:
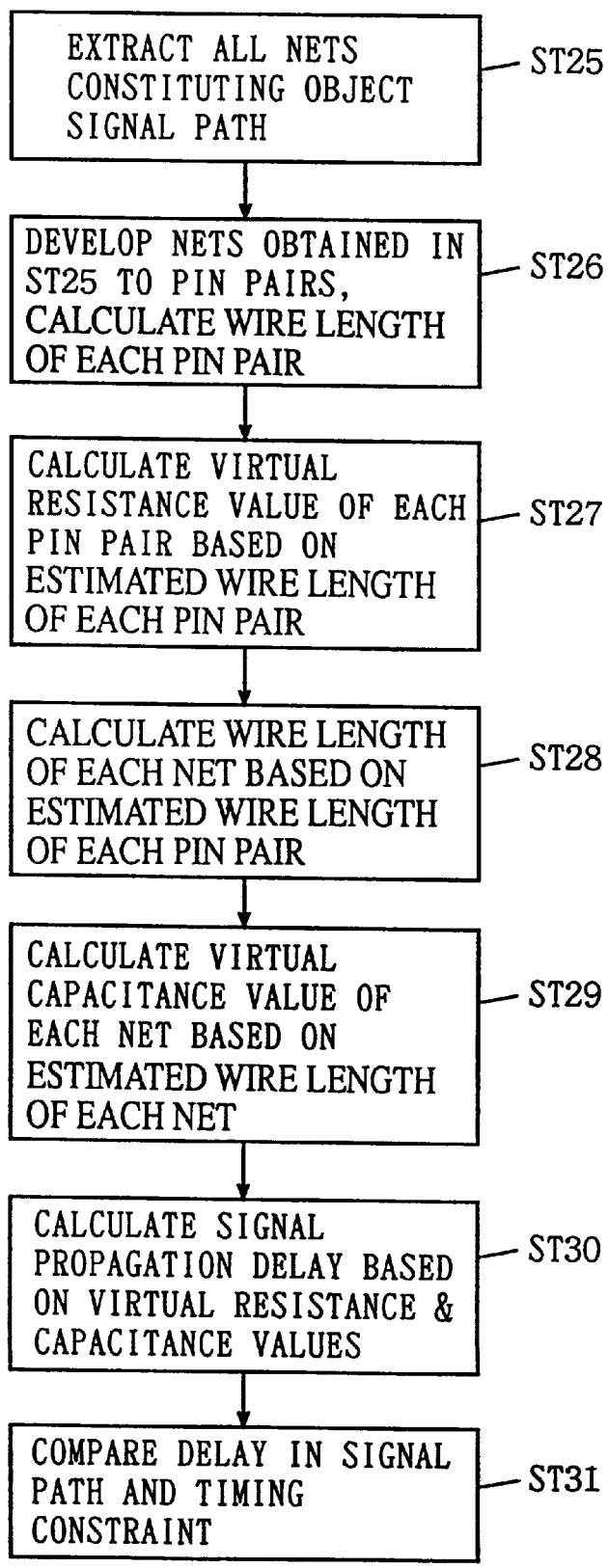
FIG. 11 is a flow chart showing processes performed by the timing verifying apparatus.

Referring to FIG. 11, the process executed by timing verifying apparatus 200 will be described. A user selects a signal path of which timing is to be verified. Thereafter, the object net selecting unit 6 extracts a net to which the signal path selected by the user belongs (ST25). The net extracted in step ST25 is developed to pin pairs, and estimated wire length of each pin pair is calculated (ST26). This process is similar to the process of steps ST2 to ST5 described in the first embodiment. Therefore, description is not repeated.

Resistance value of the virtual wiring is calculated pin pair by pin pair (ST27). The resistance value of the pin pair is obtained by multiplying the estimated wire length of the pin pair and an wiring resistance value per unit wiring length determined by the design rule.

Estimated wire length of the net to which respective pin pairs belong is estimated (ST28). This process is similar to the process of step ST6 described in the first embodiment, and therefore description is not repeated.

Capacitance value of the net to which the pin pairs belong is estimated (ST29). The capacitance value of the net is obtained by multiplying the estimated wire length of the net by an wiring capacitance value per unit wiring length determined by the design rule.

Based on the resistance value of the pin pairs and the capacitance value of the net, RC time constant of the signal path is calculated. Further, by utilizing an expression for calculating delay provided in advance in accordance with the design rule, delay time when the signal passes through the signal path is calculated (ST30).

The calculated delay time and timing constraint determined by design specification are verified and compared, and any signal path which does not satisfy the design specification is extracted. The result of timing verification is output through timing verification result output apparatus 20, and the result is stored in timing verification result storing apparatus 22 (ST31).

By timing verifying apparatus 200 described above, the resistance value of the pin pair can be estimated with precision based on the highly precise estimated wire lengths of the pin pairs. Further, the capacitance value of the net can be estimated with high precision based on the highly precise estimated wire length of the net. The highly precise resistance value of the pin pairs and the capacitance value of the net allows highly precise estimation of signal delay, and allows highly precise timing verification.

Third Embodiment

A power consumption estimating apparatus which is another embodiment of the present invention will be described.

Figure 12:
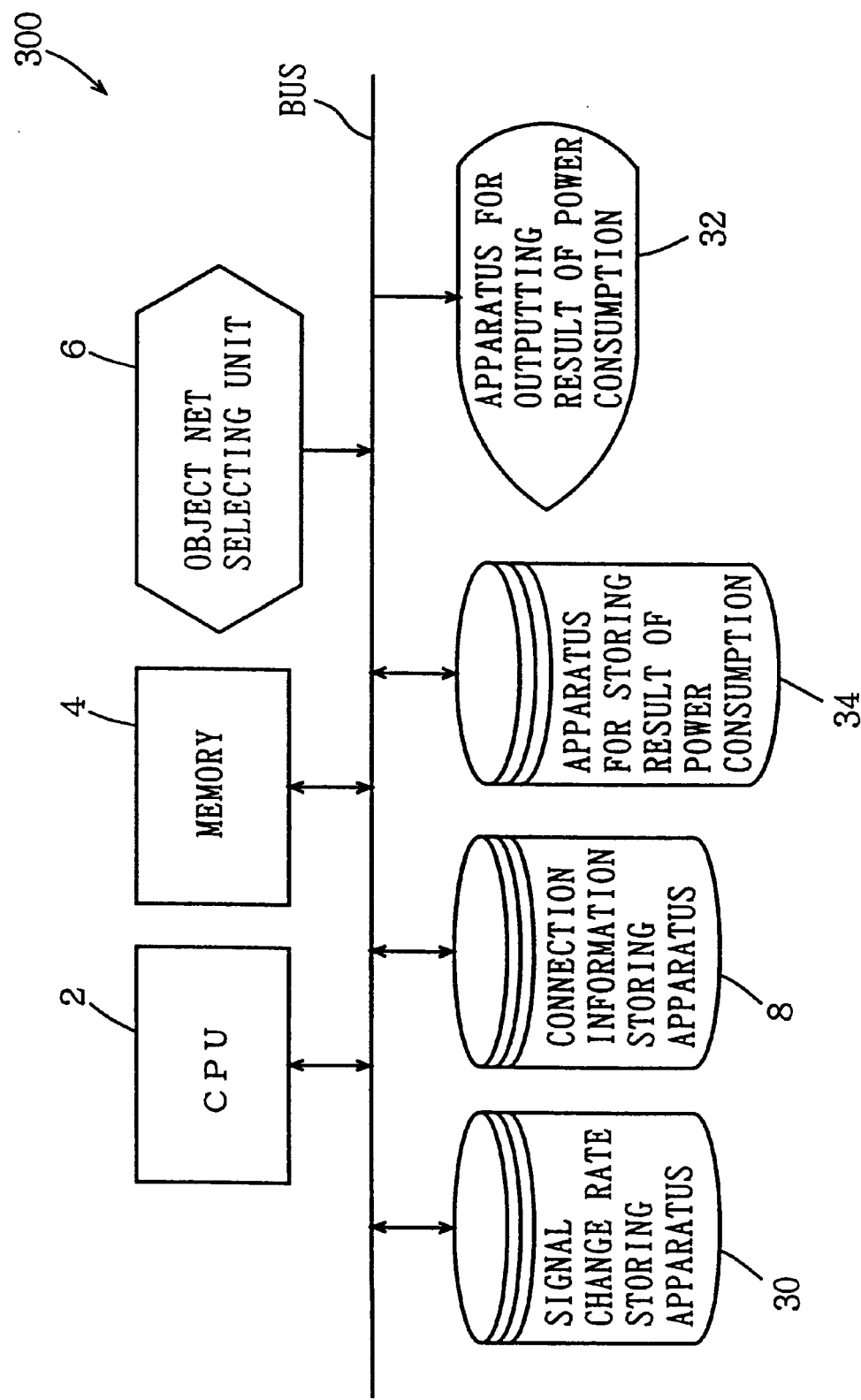
FIG. 12 is a block diagram showing configuration of a power consumption estimating apparatus in accordance with a third embodiment.

Referring to FIG. 12, power consumption estimating apparatus 300 includes: a connection information storing apparatus 8 for storing relation of connection between macro cells and nets on a semiconductor integrated circuit; a signal change rate storing apparatus 30 for storing signal change rate of the net; an object net selecting unit 6 for selecting a net of which power consumption is to be estimated; a CPU 2 for estimating power consumption of the net selected by object net selecting unit 6; a memory 4 for storing a program for estimating power consumption and intermediate result of the processing; an apparatus 32 for outputting result of power consumption estimation for presenting the result of power consumption estimation to the user; an apparatus 34 for storing result of power consumption estimation; and a bus for connecting components of power consumption estimating apparatus 300 to each other.

Figure 13:
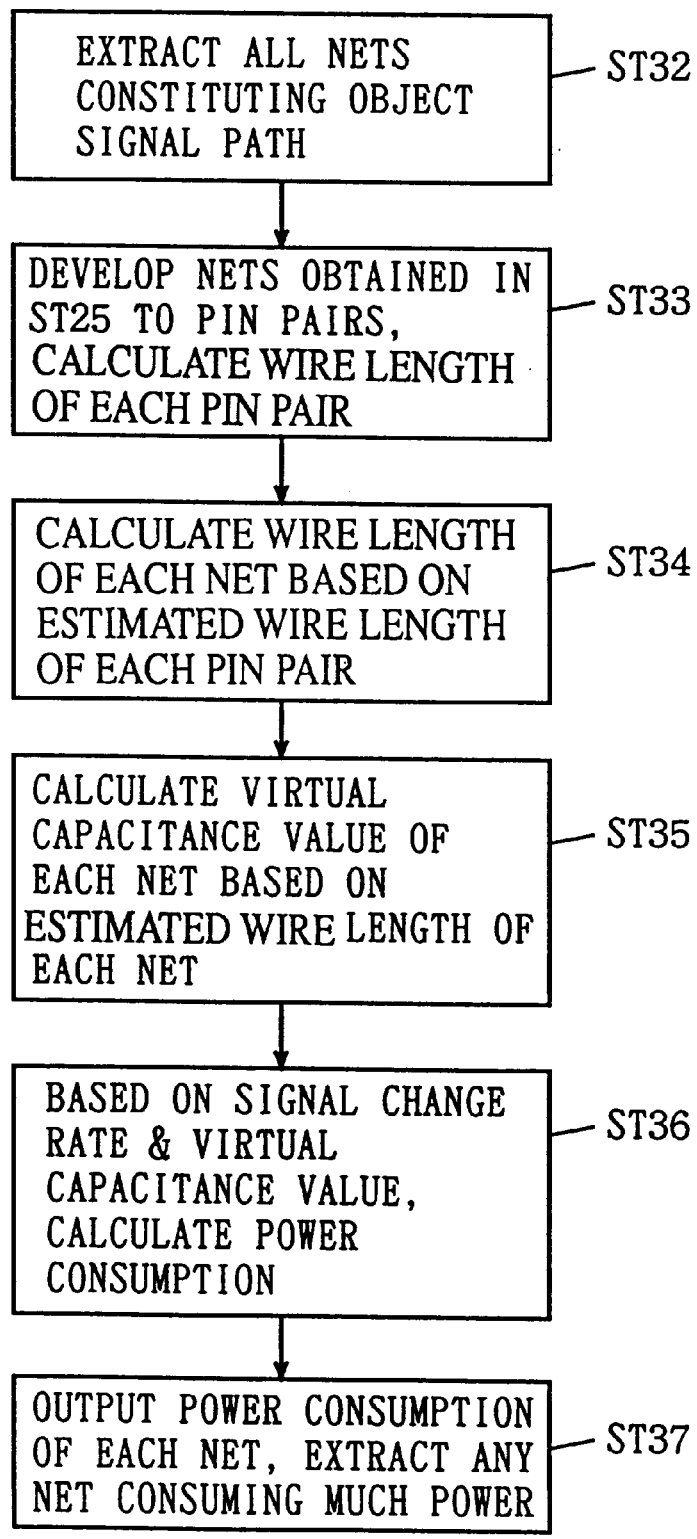
FIG. 13 is a flow chart showing processes performed by the power consumption estimating apparatus.

Referring to FIG. 13, the process executed by power consumption estimating apparatus 300 will be described. A user selects a signal path of which power consumption is to be estimated. Thereafter, object net selecting unit 6 extracts a net to which the signal path selected by the user belongs (ST32). The net extracted in ST32 is developed to pin pairs and estimated wire length of each pin pair is calculated (ST33). The process is similar to that of steps ST2 to ST5 described in the first embodiment. Therefore, description is not repeated.

Based on the estimated wire lengths of the pin pairs, the estimated wire length of the net to which the pin pairs belong is calculated (ST34). This process is similar to the process of step ST6 described in the first embodiment. Therefore, description is not repeated.

Capacitance value of the virtual wiring of each net is estimated (ST35). The capacitance value of the net is obtained by multiplying estimated wire length of the net by signal change rate of the net obtained from the result of logic simulation or the like, and further multiplying the result by a coefficient determined by design rule.

Power consumption of each net is estimated (ST36). Power consumption of the net is obtained, for example, by multiplying the capacitance value of the net by the signal change rate of the net, and multiplying the result by a coefficient determined by the design rule.

The estimated power consumption of the net is output through apparatus 32 for outputting the result of power consumption estimation, a net which consumes much power is extracted, and the result is stored in apparatus 34 for storing the result of power consumption estimation (ST37).

By the power consumption estimating apparatus 300 described above, the capacitance value of the net can be estimated with high precision based on highly precise estimated wire length of the net. Accordingly, power consumption of the net can be estimated with high precision using the highly precise capacitance value of the net and the signal change rate of the net.

Fourth Embodiment

An apparatus for estimating minimum area allowing placement and wiring, which is still another embodiment of the present invention, will be described in the following.

Figure 14:
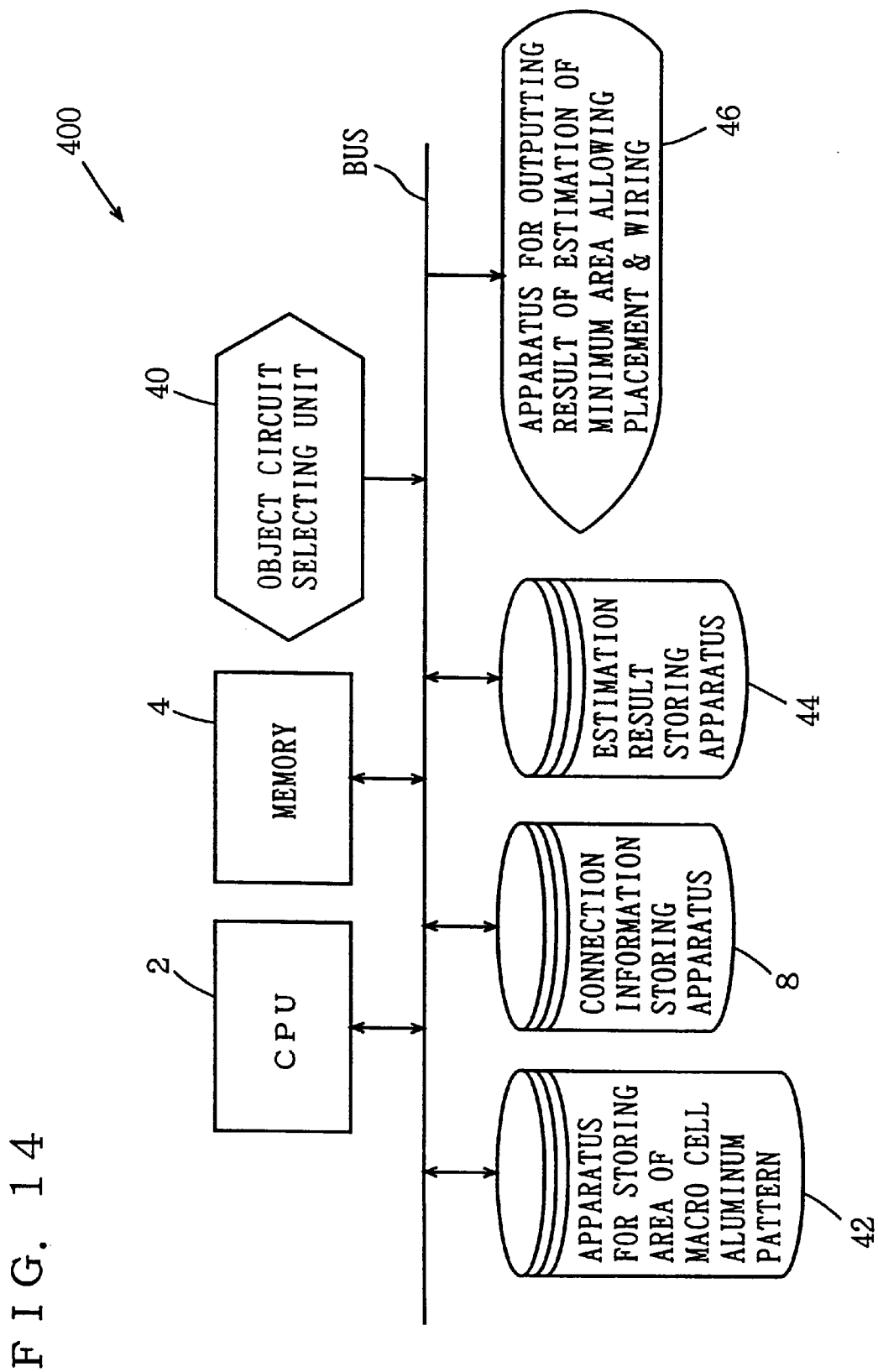
FIG. 14 is a block diagram showing configuration of an apparatus for estimating minimum area allowing placement and wiring in accordance with a fourth embodiment.

Referring to FIG. 14, apparatus 400 for estimating minimum area allowing placement and wiring includes: a connection information storing apparatus 8 for storing relation of connection between macro cells and nets in a semiconductor integrated circuit; an object circuit selecting unit 40 for selecting a semiconductor integrated circuit of which minimum area allowing placement and wiring is to be estimated; an area storing apparatus 42 for storing area of aluminum patterns occupied by the macro cells in the semiconductor integrated circuit; a CPU 2 for estimating minimum area necessary for placement and wiring of macro cells, based on the area of the aluminum patterns of the macro cells and the total estimated wire lengths of the semiconductor integrated circuit; a memory 4 for storing a program for estimating the minimum area and intermediate result of processing; an apparatus 46 for outputting result of estimation of the minimum area allowing placement and wiring, for presenting the result of estimation of the minimum area to the user; an estimation result storing apparatus 44 for storing the result of estimation of the minimum area allowing placement and wiring; and a bus for connecting components of the apparatus 400 for estimating the minimum area with each other.

Figure 15:
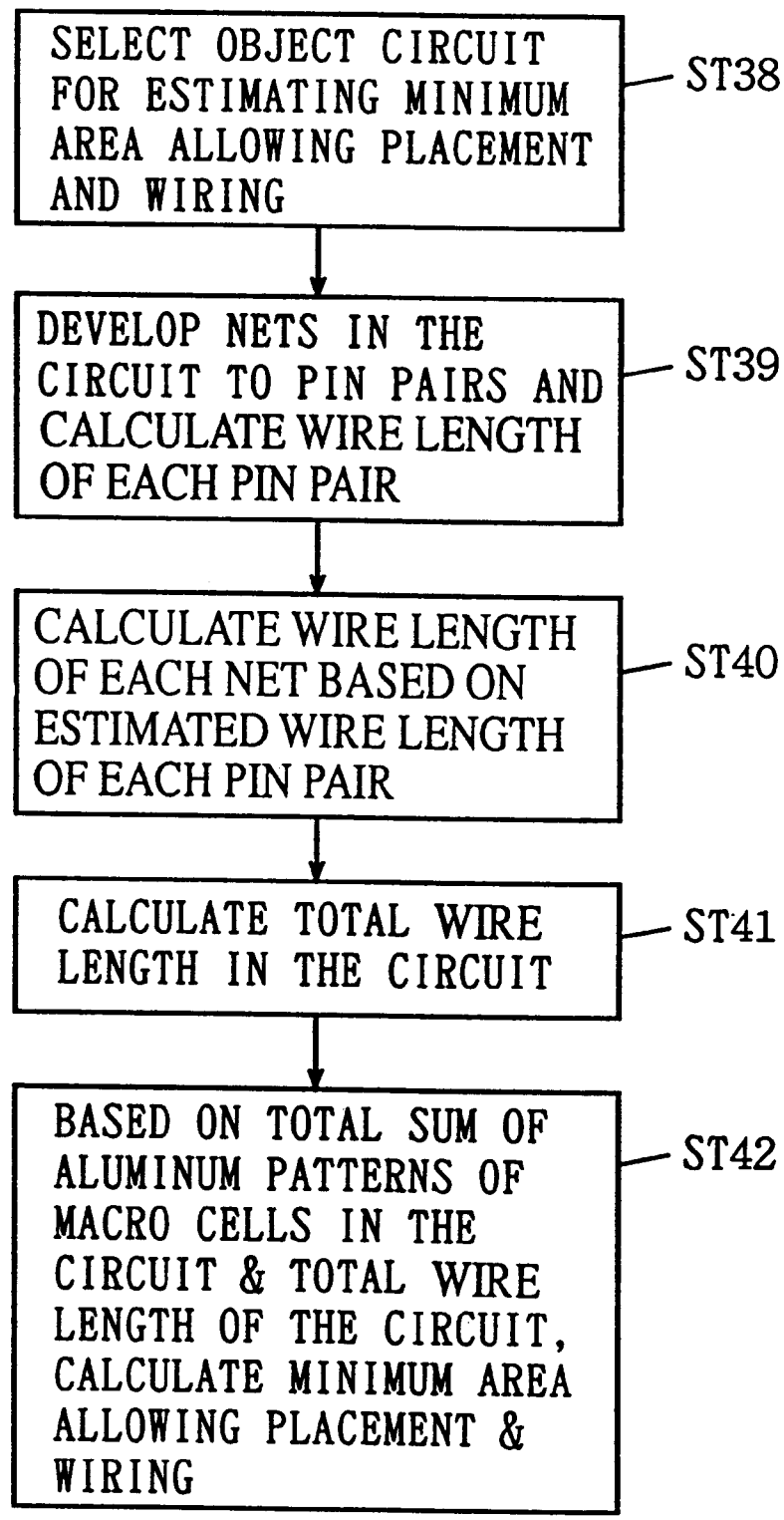
FIG. 15 is a flow chart showing processes performed by the apparatus for estimating minimum area allowing placement and wiring.

Referring to FIG. 15, the process executed by the apparatus 400 for estimating minimum area allowing placement and wiring will be described. A user selects a semiconductor integrated circuit of which minimum area is to be estimated (ST38). A net on the semiconductor integrated circuit device selected in step ST38 is developed into pin pairs, and estimated wire length is calculated for each pin pair (ST39). This process is similar to the process of steps ST2 to ST5 described in the first embodiment, and therefore, description is not repeated.

Based on the estimated wire lengths of the pin pairs, estimated wire length of the net to which the pin pairs belong is calculated (ST40). The process is similar to that of step ST6 described in the first embodiment. Therefore, description is not repeated.

Total estimated wire length of the semiconductor integrated circuit is estimated (ST41). The total estimated wire length of the semiconductor integrated circuit refers to the sum of estimated wire lengths of the nets existing in the semiconductor integrated circuit.

Based on the total estimated wire length of the semiconductor integrated circuit and the area of aluminum patterns occupied by the macro cells in the semiconductor integrated circuit, minimum area allowing placement and wiring of macro cells is calculated in accordance with the following equation (13) (ST42). The equation (13) is derived in accordance with a rule that when macro cells are placed and wired in minimum area, the value of aluminum pattern grid used by the semiconductor integrated circuit assumes a constant value depending on the design rule. More specifically, occupation of aluminum grid=η (constant value) is substituted into the following equation (14) for calculating aluminum wiring grid occupation, and the equation is solved for the area of placement and wiring.

$$V1 = \frac{V2 \times \varepsilon + V3 \times \zeta}{\eta \times \delta} \quad (13)$$

$$V4 = \frac{V2 \times \varepsilon + V3 \times \zeta}{V1 \times \delta} \quad (14)$$

V1: Area of placement and wiring
V2: Area of aluminum patterns of macro cell
V3: Total estimated wire length of the circuit
V4: Aluminum wiring grid occupation Here, coefficients $\varepsilon$, $\zeta$, $\delta$ and $\eta$ are values all determined dependent on the design rule. The minimum area is output through the output apparatus 46 for outputting the result of estimation of the minimum area allowing placement and wiring, and stored in estimation result storing apparatus 44.

By the apparatus 400 for estimating minimum area allowing placement and wiring described above, the total sum of estimated wire lengths of the net existing in the semiconductor integrated circuit can be estimated with high precision. Based on the total sum and the area of aluminum patterns occupied by the macro cells in the semiconductor integrated circuit, the minimum area allowing placement and wiring of the macro cells can be estimated with high precision.

Fifth Embodiment

Figure 16:
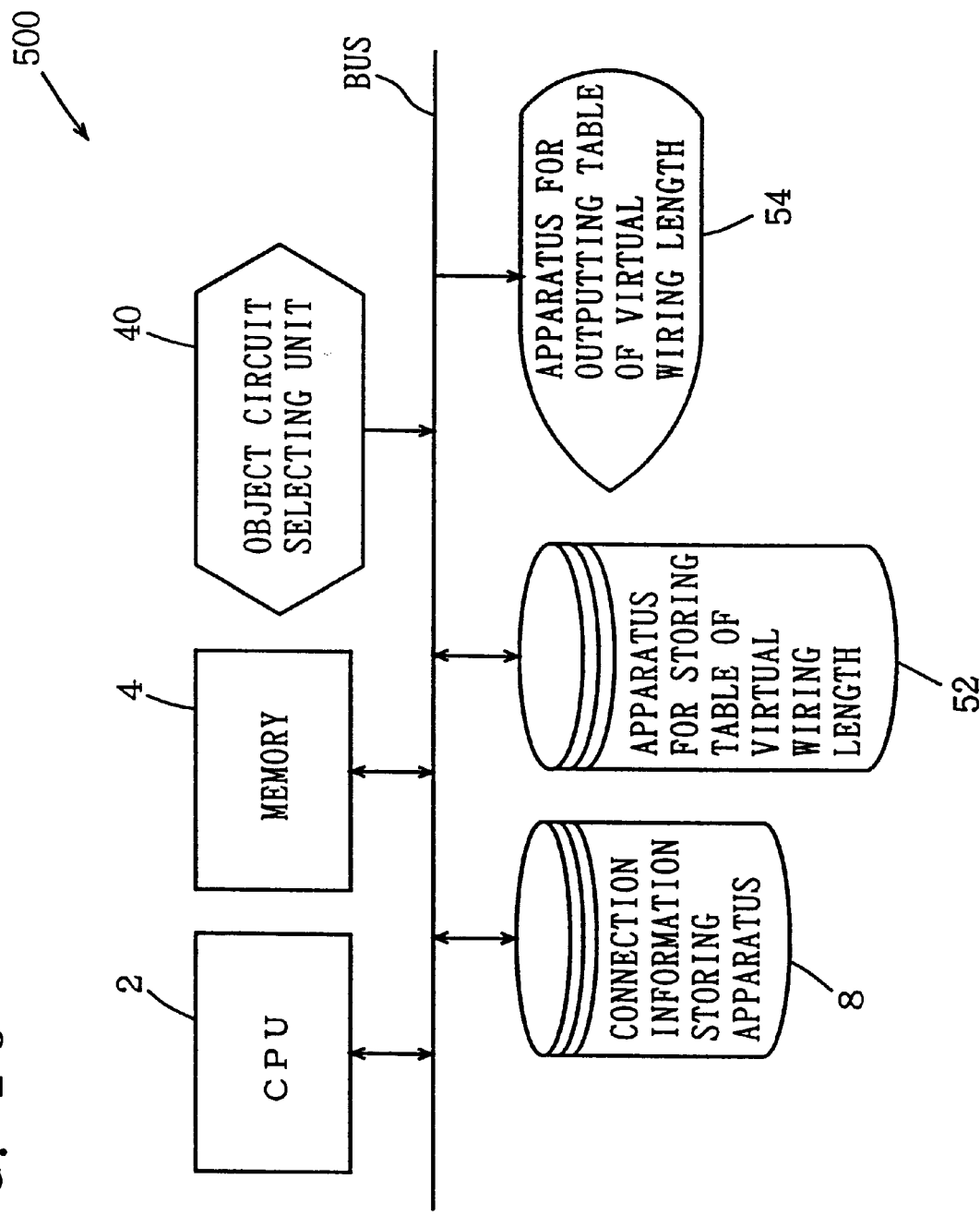
FIG. 16 is a block diagram showing configuration of an apparatus for forming a estimated wire length table in accordance with a fifth embodiment.

Referring to FIG. 16, an apparatus 500 for forming a table of estimated wire length in accordance with the present embodiment includes: a connection information storing apparatus 8 for storing relation of connections between macro cells and nets of a semiconductor integrated circuit; an object circuit selecting unit 40 for selecting a semiconductor integrated circuit for which a table of estimated wire length is to be formed; a CPU 2 for providing the table of estimated wire length for finding a estimated wire length of a net, using fan out number of the net as an index; a memory 4 for storing a program of the process for providing the table of estimated wire length and storing intermediate result of the process; an output apparatus 54 for presenting the table of estimated wire length to the user; a storing apparatus 52 for storing the table of estimated wire length; and a bus for connecting components of the table forming apparatus 500 to each other.

In the apparatus 500 for forming the table of estimated wire length, the table of estimated wire length used for fabricating a net list using HDL (Hardware Description Language) is prepared.

Figure 17:
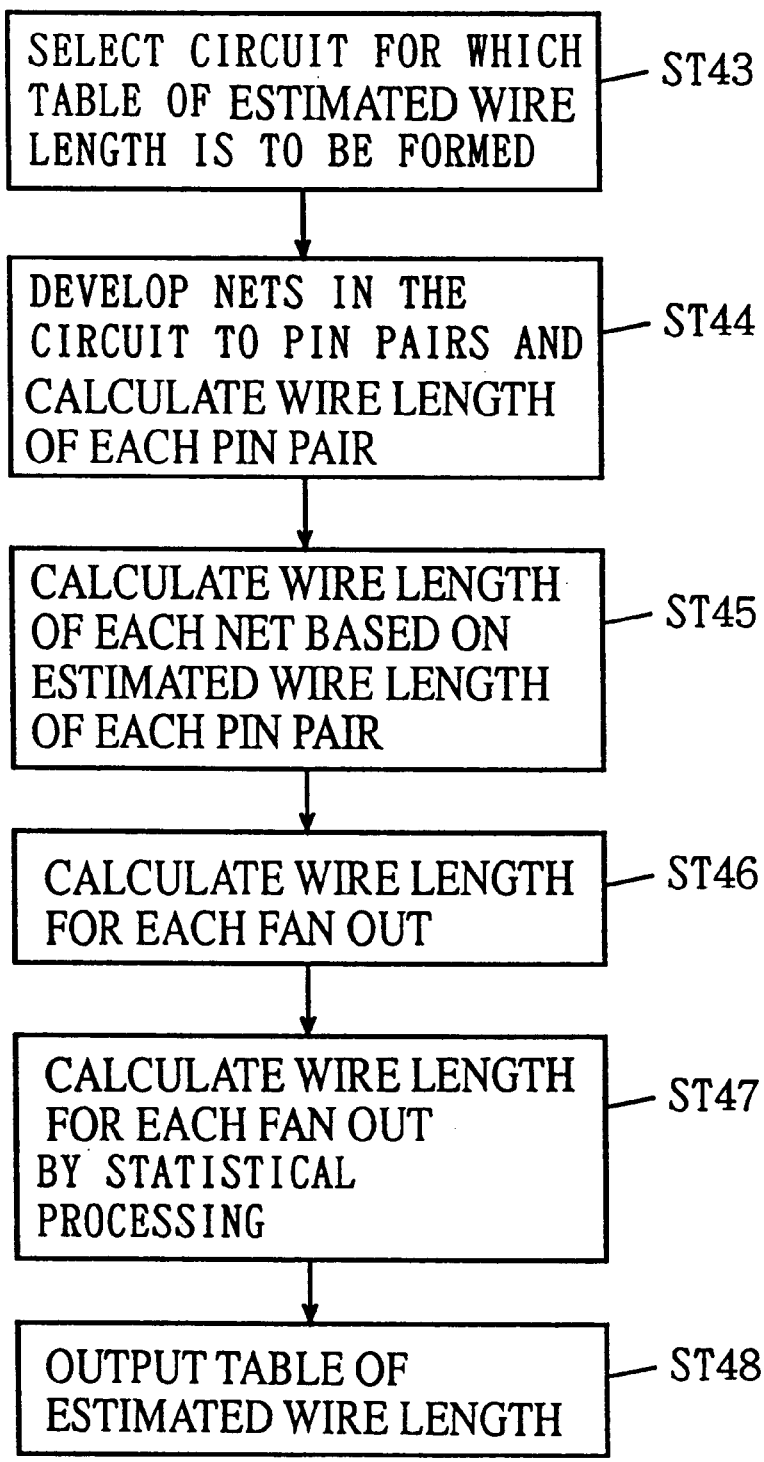
FIG. 17 is a flow chart showing processes performed by the apparatus for forming estimated wire length table.
Figure 18A:
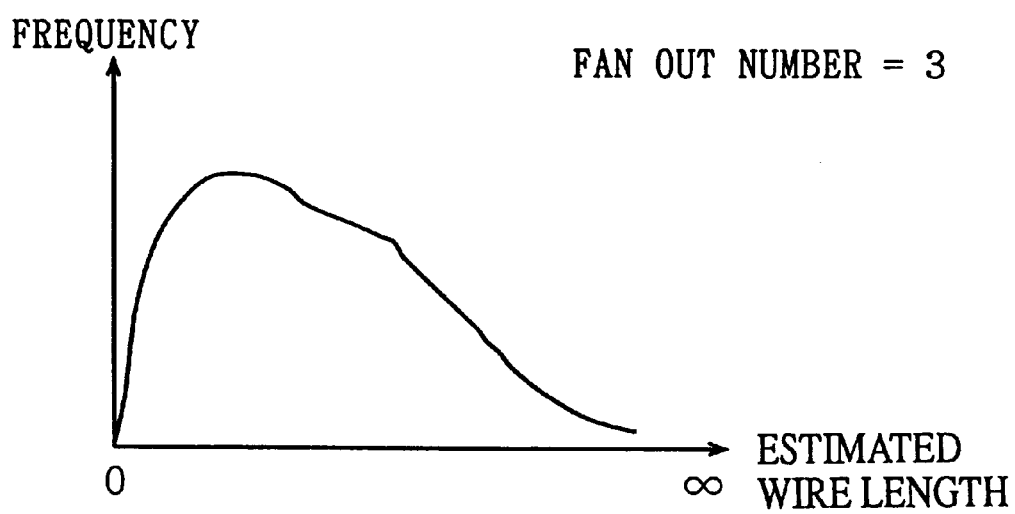
FIGS. 18A and 18B are histograms for the estimated wire length of the net.
Figure 18B:
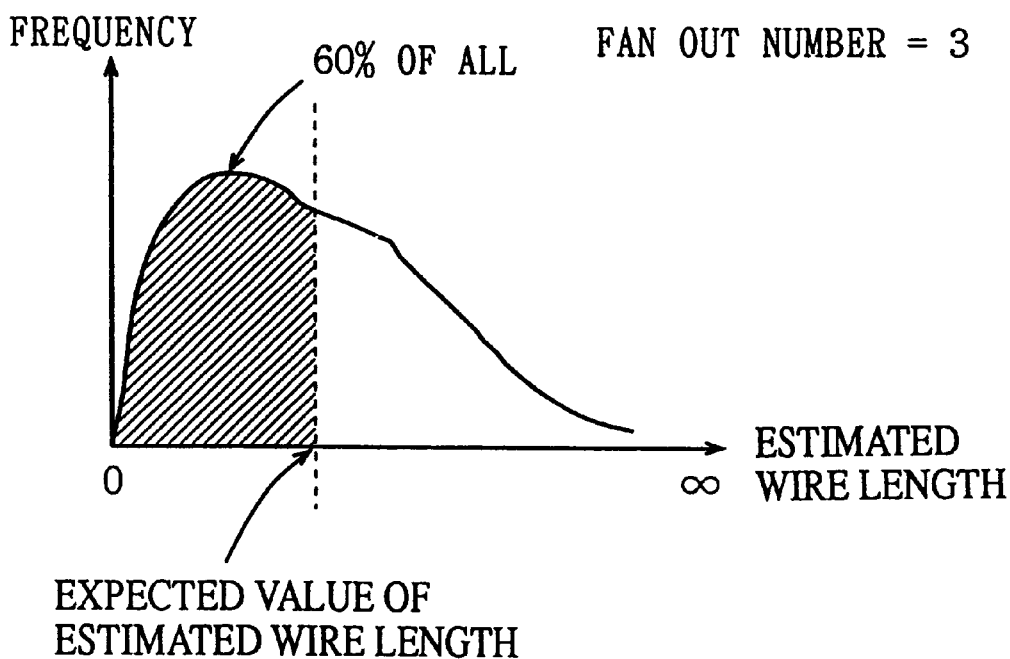

Referring to FIGS. 17 to 18B, the process executed in the apparatus 500 for forming the virtual wiring table will be described. A user selects a semiconductor integrated circuit which is used as data for forming the table of estimated wire length (ST43). Nets of the semiconductor integrated circuit selected in step ST43 are developed to pin pairs, and estimated wire length of each pin pair is calculated (ST44). The process is similar to that of steps ST2 to ST5 described in the first embodiment. Therefore, description is not repeated.

Based on the estimated wire lengths of the pin pairs, the estimated wire length of the net to which the pin pairs belong is calculated (ST45). This process is similar to that of the step ST6 described in the first embodiment. Therefore, description is not repeated.

The nets are classified in accordance with the number of fan outs, and a histogram of the net with respect to the estimated wire length is prepared for each fan out number (ST46, FIG. 18A).

Based on the histogram of the net with respect to the estimated wire length, expected value of the estimated wire length or each fan out number is calculated. More specifically, a certain estimated wire length when the number of nets having estimated wire lengths shorter than the certain wiring length occupies a prescribed ratio with respect to the total number of nets is regarded as the expected value of the estimated wire length of the net for that fan out number (ST47, FIG. 18B).

Figure 19A:
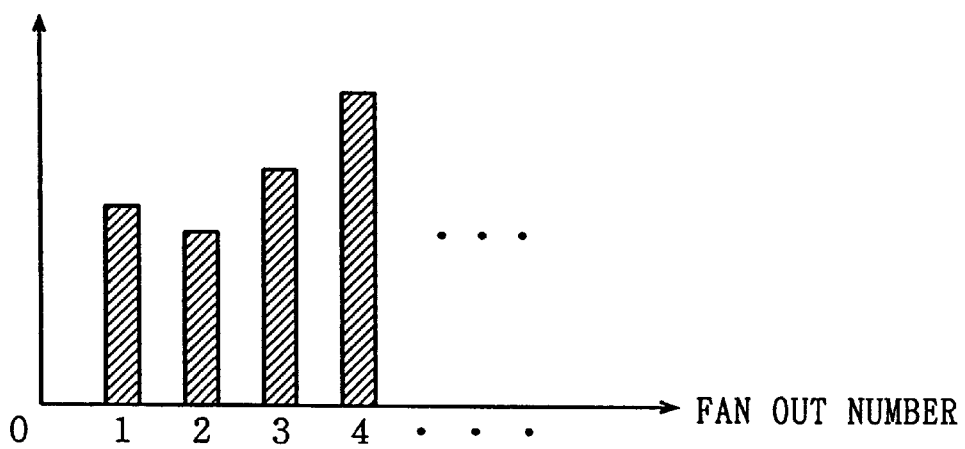
FIGS. 19A and 19B are graphs showing estimated values of estimated wire lengths of nets with respect to the number of fan outs.
Figure 19B:
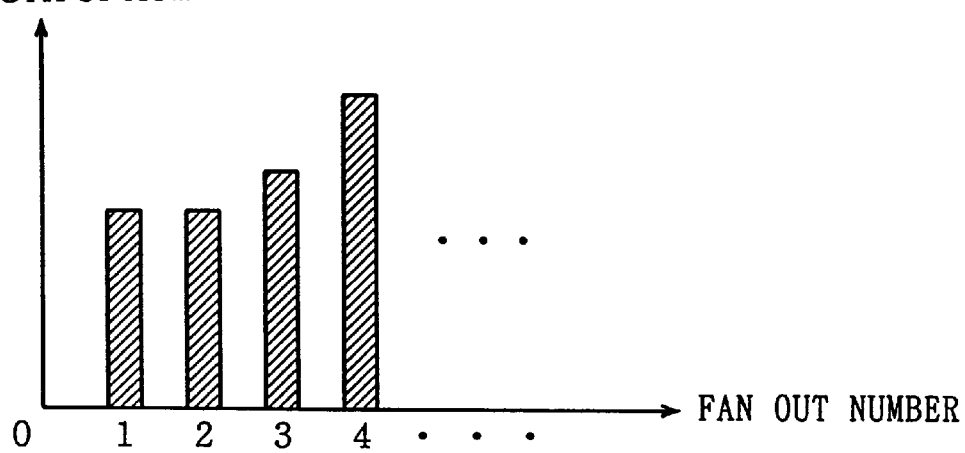

A two-dimensional graph in which the abscissa represents the number of fan outs and the ordinate represents the expected value of the estimated wire length of the net is prepared (FIG. 19A). Graph is modified so that expected value of the estimated wire length of the net increases monotonically as the fan out number increases. More specifically, an expected value for a certain fan out number is compared with an expected value for another fan out number smaller by one than said certain fan out number, and when the expected value for the certain fan out number is smaller than the latter fan out number, the expected value of the certain fan out number is replaced by the expected value for the latter fan out number (FIG. 19B).

Based on the new graph, the table for the estimated wire length is formed, the table is output through the table output apparatus 54, and stored in storing apparatus 52 (ST48).

By the apparatus 500 for forming the table of estimated wire length described above, expected value of the estimated wire length of the net for each fan out number is calculated with high precision, based on the estimated wire lengths of nets classified in accordance with the number of fan outs. Based on the result of calculation, a highly precise table of the estimated wire lengths can be formed.

In the first to fourth embodiments, estimated wire lengths and the like may be calculated not for the macro cells but for modules containing one of more macro cells, and the calculated estimated wire length and the like may be presented to the user. In that case, estimated wire length and the like can be estimated for modules, which allows the user to prepare a floor plan with high efficiency.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of estimating wire length, comprising the steps of:
    defining a net on a semiconductor integrated circuit and extracting pin pairs from said net, said pin pairs represented by an edge between any pair of nodes of a complete graph in which macro cells on the net serve as nodes;
    estimating wire length of each of said pin pairs; and
    estimating wire length of said net based on the estimated wire length of each of said pin pairs; wherein said step of estimating the estimated wire length of each pin pair includes the steps of extracting a subcircuit satisfying a prescribed relation with a pin pair which is an object of processing, and estimating wire length of said object pin pair based on a characteristic of said subcircuit.

2. The method of estimating wire length according to claim 1, wherein:

said step of extracting said subcircuit includes the steps of extracting, as the subcircuit, said object pin pair and a macro cell connected to said object pin pair, said subcircuit including an externally connected cell connected to a pin pair outside said subcircuit, extracting a macro cell connected to said externally connected cell, classifying the macro cell connected to said externally connected cell into an already-searched macro cell or a not-yet-searched macro cell, determining whether a number of said already-searched macro cell and a number of said not-yet-searched macro cell satisfy a prescribed relation, completing processing using the already-searched macro cell and a pin pair as the subcircuit for said object pin pair when said prescribed relation is satisfied, and adding a pin pair and a macro cell classified as a not-yet-searched macro cell to the subcircuit and returning to said step of extracting when said prescribed relation is not satisfied, wherein the pin pair added in said adding step connects the macro cell classified as not-yet searched with an outer peripheral cell in the subcircuit.

3. The method of estimating wire length according to claim 2, wherein:

said step of determination includes the steps of determining that said prescribed relation is satisfied when number of said already-searched macro cell is larger than number of said not-yet-searched macro cells, and determining that said prescribed relation is not satisfied when the number of said already-searched macro cell is not larger than the number of said not-yet-searched macro cells.

4. The method of estimating wire length according to claim 1, wherein:

said step of estimating wire length of said object pin pair includes the steps of based on number of pin pairs of the net in said subcircuit and total sum of areas of macro cells in said subcircuit, calculating minimum area allowing placement and wiring of said macro cells in said subcircuit, and based on said minimum area, obtaining a value changing in proportion to boundary length of a rectangle having said minimum area as the estimated wire length of said object pin pair.

5. The method of estimating wire length according to claim 1, wherein said step of estimating wire length of said net includes:

removing from the extracted pin pairs pin pairs not corresponding to designated wiring portions, estimating a total sum of wire lengths between said pin pairs and subtracting from said total sum an estimated wire length portion corresponding to wire length portions shared by said pin pairs.

6. The method of estimating wire length according to claim 1, further comprising the steps of:

based on the estimated wire length of said pin pair, calculating resistance value of said pin pair;

based on the estimated wire length of said net, calculating capacitance value of said net; and based on the resistance value of said pin pair and the capacitance value of said net, calculating delay time when a signal passes through a signal path on said net.

7. The method of estimating wire length according to claim 6, further comprising the step of:

comparing said delay time with a constraint value determined based on design rule, and extracting any signal path not satisfying the design rule.

8. The method of estimating wire length according to claim 1, further comprising the steps of:

based on the estimated wire length of said net, calculating capacitance value of said net; and based on the capacitance value of said net and a prescribed net signal change rate, calculating power consumption of said net.

9. The method of estimating wire length according to claim 1, further comprising the steps of:

calculating total sum of estimated wire lengths of said net existing in said semiconductor integrated circuit; and based on the total sum of the estimated wire lengths of said net and areas of aluminum patterns occupied by macro cells in said semiconductor integrated circuit, calculating minimum area allowing placement and wiring of said macro cells in said semiconductor integrated circuit.

10. The method of estimating wire length according to claim 1, further comprising the steps of:

classifying said net in accordance with fan out number of said net; and calculating an expected value of estimated wire length of said net for each fan out number, in accordance with a prescribed rule.

11. A method for estimating wire length on a semiconductor integrated circuit, comprising the steps of:

selecting an object net of which wire length is to be estimated, the object net including a plurality of macro cells and at least one wire interconnecting said macro cells;

extracting at least one pin pair from said object net, wherein each pin pair represents an edge between nodes of a complete graph derived from said macro cells which serve as nodes of the complete graph;

selecting an object pin pair from said object net;

extracting all macro cells externally connected by said pin pairs to said first and second macro cells;

classifying said extracted macro cells included in said subcircuit as already-searched macro cells, and said extract macro cells not included in said subcircuit as not-yet-searched macro cells;

comparing a first number of said already-searched macro cells and a second number of not-yet-searched macro cells, and determining said object pin pair and two macro cells connected thereto as a subcircuit if said first number is larger than said second number and completing the process, otherwise returning to said object pin selecting step to select another pin pair from said net.

* * * * *